United States Patent [19]

Webb

[11] Patent Number: 4,859,944

[45] Date of Patent: Aug. 22, 1989

[54] SINGLE-WINDING MAGNETOMETER WITH OSCILLATOR DUTY CYCLE MEASUREMENT

[75] Inventor: Spencer L. Webb, Belmont, Mass.

[73] Assignee: Analog Devices, Inc., Norwood, Mass.

[21] Appl. No.: 89,148

[22] Filed: Aug. 25, 1987

[51] Int. Cl.$^4$ .................... G01R 33/04; G01C 17/28
[52] U.S. Cl. ....................... 324/253; 33/361; 331/65
[58] Field of Search ................. 324/253–255, 324/117 R; 340/870.33; 33/361, 355 R, 363 R; 331/65

[56] References Cited

U.S. PATENT DOCUMENTS

| | | | |
|---|---|---|---|
| 2,991,414 | 7/1961 | Tillman | 324/253 |
| 3,040,247 | 6/1962 | Van Allen | 324/253 |
| 3,427,534 | 2/1969 | Maxwell | 324/117 R |
| 3,454,879 | 7/1969 | Smitka | 324/117 R |
| 3,461,382 | 8/1969 | Anderson | 324/253 |
| 3,768,011 | 10/1973 | Swain | 324/253 X |
| 4,059,796 | 11/1977 | Rhodes | 324/253 |
| 4,060,761 | 11/1977 | Rhodes | 324/253 |
| 4,277,751 | 7/1981 | Lawson et al. | 324/254 |
| 4,305,034 | 12/1981 | Long et al. | 324/253 |
| 4,305,035 | 12/1981 | Mach | 324/255 |
| 4,314,200 | 2/1982 | Marek | 324/253 X |
| 4,321,536 | 3/1982 | Rhodes | 324/253 |
| 4,402,142 | 9/1983 | Dinsmore | 33/348 |
| 4,447,776 | 5/1984 | Brown | 324/253 |
| 4,539,706 | 9/1985 | Marchent et al. | 33/356 |
| 4,626,782 | 12/1986 | Lewis | 324/253 |
| 4,677,381 | 6/1987 | Geerlings | 324/253 |
| 4,728,888 | 3/1988 | Bauer et al. | 324/253 |
| 4,733,181 | 3/1988 | Bauer | 324/253 |

FOREIGN PATENT DOCUMENTS 0065589 12/1982 European Pat. Off. .

OTHER PUBLICATIONS

Takeuchi et al., "A Resonant . . . Magnetometer . . . ", IEEE Transactions on Magnetics, vol. MAG-20 (Sep. 1984) pp. 1723–1725.

W. A. Geyger: "New Type of Flux-Gate Magnetometer"—*Journal of Applied Physics*, Mar. 1962, pp. 1280–1281.

M. H. Acuna and C. J. Pellerin: "A Miniature Two-Axis Fluxgate Magnetometer", *IEEE Transactions on Geoscience Electronics*, Oct., 1969, pp. 253–260.

D. Garner: "A Magnetic Heading Reference for the Electro/Fluidic Autopilot"; *Sport Aviation*, Nov. 1981, 8 pages.

D. Garner: "Improved Flux-Gate Magnetometer"; NASA Tech Briefs, Oct., 1987, pp. 27 and 28.

J. Gosch: "Smart Compass Pilots A Car to Its Destination"; *Electronics*, May 26, 1986, pp. 20 and 21.

G. Steinbaugh: "Hall Compass Points Digitally to Headings", *Electronics*, Dec., 1980, pp. 112 and 114.

*Primary Examiner*—Gerard R. Strecker
*Attorney, Agent, or Firm*—Wolf, Greenfield & Sacks

[57] ABSTRACT

A magnetometer having only a single coil winding for sensing the magnetic field along a single axis. Functionally, the invention comprises an oscillator, and means for measuring the duty cycle thereof. The oscillator uses a saturating inductor which also serves as the magnetic-field-sensing element. The inductor is driven with a position voltage and when the current through the inductor exceeds a value which indicates that the core is saturated, the driving voltage switches to an equal-magnitude negative value. This negative drive is maintained until the current again indicates the core to be saturated, at which point the driving voltages switches back to the positive value. With no externally applied field, the inductor current averages to a zero value and the duty cycle of the driving voltage is fifty percent. An externally applied field helps the core saturate in one direction and hinders it in the other, resulting in a change in average inductor current and drive duty cycle.

10 Claims, 3 Drawing Sheets

SINGLE-WINDING MAGNETOMETER WITH OSCILLATOR DUTY CYCLE MEASUREMENT

FIELD OF THE INVENTION

This invention relates to magnetometers—i.e., instruments for magnetic field sensing and measurement. More fully, it relates to a new type of magnetometer which uses a coil having only a single winding per axis of detection.

BACKGROUND OF THE INVENTION

A magnetometer is a device which measures magnetic field and provides a signal which is related to the field intensity. Magnetometers have long been known and have many applications. There are several types of magnetometers, including those which are mechanical in nature and those which are electrical and electronic. One popular type of electronic magnetometer is called a flux-gate magnetometer. Flux-gate magnetometers operate by saturating and unsaturating a magnetic core about which a sense winding is provided. The operation of saturating and unsaturating the core is achieved with a drive signal applied to a drive winding on the same core. The drive winding alternatively concentrates flux lines through the sense winding and allows them to relax. This arrangement thus serves as a gate or valve for the magnetic flux. An external magnetic field interacts with the magnetic field generated by the sense winding in a way which can be detected through electronic circuitry connected to the sense winding. The output signal of a flux-gate magnetometer is a voltage which is linearly proportional to the external magnetic field. The reader will appreciate that compasses can readily be constructed from devices having these properties. Such compasses are useful, for example, in automotive, marine, and aircraft navigation.

In compass applications, two or more magnetometers are generally employed, at least one per axis. Electronic circuitry processes the information about field changes along the two orthogonal axes to derive heading information. We may consider each axis separately as the two magnetometers are normally of the same design and construction. More than two axes are sometimes used, to increase the signal-to-noise ratio of the measurement, or to detect magnetic dip angle.

Prior magnetometers comprise two or more coil windings and a number of electronic circuits. One of the windings is driven by an electronic signal and at least one of the other windings then produces an output which depends not only on the driving signal, but also on changes in flux within the driven and sensing windings produced by movement or reorientation of those windings. For example, in U.S. Pat. No. 4,305,035, issued Dec. 8, 1981, in the name of Dedina O. Mach et al., two coils are used for sensing along each axis. Each coil pair has its own electronics and each coil pair is wound on separate, small strips of core material; the coils are positioned in a gimballed fixture for use as an electronic compass. One of the coils in each pair is a driving coil to which a driving signal is applied and the other coil is a field-sensing coil. In a two-axis compass application, each of the sensing coils senses only the component of magnetic field in one plane, with one output being representative of the field along the axis of one of the coils and the other being representative of the field along the axis of the other coil. The driving signal applied to each driving coil is of triangular waveshape, to saturate the coil core in alternating, opposite directions. An applied field has an additive effect during one-half of the excitation cycle and a subtractive effect during the other one-half cycle, producing a tendency to establish a net dc level in the sensed waveform. This dc component is removed and the signal required to do so is used as a representation of the applied field strength. As seen in FIG. 1 of that patent, the there-indicated embodiment of the invention not only requires the aforementioned multiple coils, but also (for each axis) six operational amplifiers and numerous additional components.

A flux-gate magnetometer which employs three coils and one drive winding for two-axis sensing is marketed by KVH Industries, Inc., Middleton, Rhode Island, as part of that company's KVH PC103 flux-gate compass and related products. According to KVH literature, its sensor uses a toroidal flux-gate magnetometer with a free floating ringcore in the center. The core is made of a stainless steel bobbin wound with Permalloy (a registered trademark) brand tape. A drive field is applied to the core and the external field interaction with the drive field produces an asymmetric change of core flux. This change in core flux is detected by a secondary winding over the core and the resultant signal is then processed.

Other multiple winding flux-gate magnetometer compasses are shown, for example, in U.S. Pat. No. 3,899,834 and in U.S. Pat. No. 4,277,751.

OBJECTS AND SUMMARY OF THE INVENTION

Applications exist, however, for smaller and less expensive magnetic field sensors. The aforementioned U.S. Pat. No. 4,277,751, for example, indicates a need for magnetometers of reduced power dissipation.

It is therefore an object of the present invention to provide a very low-cost magnetometer.

At least partially in accordance with the foregoing, another object of the present invention is to provide a magnetometer using a reduced number of coil windings.

Yet another object of the present invention is to provide a magnetometer using fewer circuit components than prior art magnetometers.

The foregoing and other objects and advantages of the present invention (which will become more apparent from reading the detailed description below) are achieved using a magnetometer which requires only a single coil winding to sense the magnetic field along a single axis. The magnetometer relies on the use of a saturable core material of high permeability. The shape of the core depends upon the application; a toroidal core may be used for sensing current, while a cylindrical core may be used for sensing the earth's magnetic field.

Functionally, the invention comprises an oscillator, which uses a saturating inductor for energy storage and for magnetic-field sensing. The inductor drive alternates between positive and negative, as follows: Briefly, the inductor is driven with a positive voltage until the current through the inductor exceeds a value which indicates that the core is saturated; at that point, the driving voltage switches to an equal-magnitude negative value. The negative drive is applied until the current through the inductor exceeds a value which indicates that the core is saturated in the opposite direction, at which time the driving voltage switches back to a positive value. With no externally applied field, zero average inductor current is achieved. An externally applied field, however, causes the core to saturate in more readily one direction and less readily in the other; this results in a change in average inductor current and, as a side-effect, departure of the duty cycle of the driving voltage from the nominal 50%. Means are provided for sensing that duty cycle variation, which is taken as a measure of the strength of the external magnetic field impinging on the inductor.

The invention is distinguished by the need for only a single coil winding for each axis, by the use of flux balancing and by the architecture and simplicity of the electronics, with attendant low power requirements and low manufacturing cost.

The invention will be more fully understood by reference to the detailed description below, which should be read in conjunction with the accompanying drawings, which are incorporated by reference herein.

DETAILED DESCRIPTION OF THE INVENTION

A more complete functional description of the basic magnetometer according to the present invention will now be provided with reference to FIG. 1 and subsequently identified figures.

Figure 1:
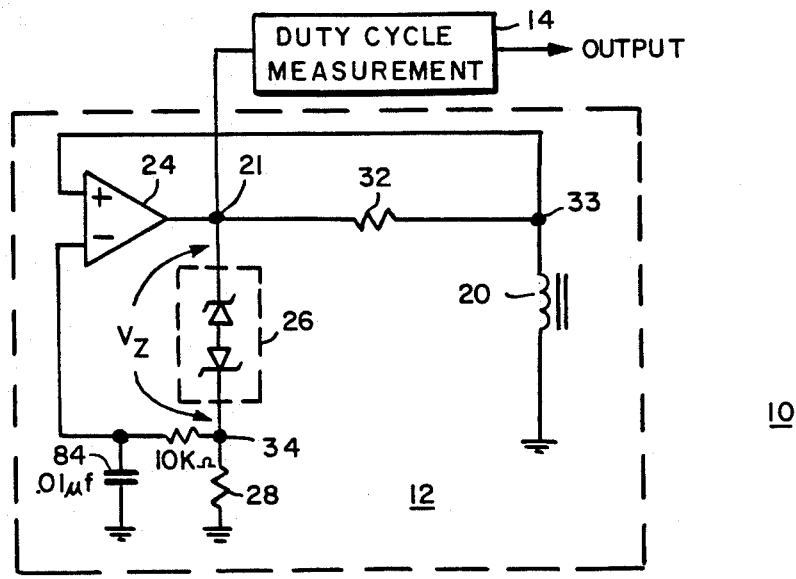
FIG. 1 is a partially-block, partially-schematic circuit diagram of a magnetometer according to the current invention.

FIG. 1 shows not only a block diagram of the invention, but also a very basic implementation of certain of the blocks. Briefly, the magnetometer 10 comprises an oscillator 12 and a means 14 for measuring duty cycle (or equivalently detecting duty cycle variations) of the oscillation. The saturating inductor 20 of the oscillator 12 is the magnetic field-responsive sensing element.

A comparator 24 controls the polarity of the drive to the inductor. Comparator 24 receives at its non-inverting input the voltage across the inductor 20; a reference voltage is applied to the inverting input of the comparator. The reference voltage is obtained by placing in series between the comparator's output and ground (i.e., a point in common with one end of the inductor) a bipolar voltage source (i.e., a pair of reverse-connected Zener diodes) 26 and a resistor 28, the latter being connected between ground and the bipolar voltage source. The reference voltage is that voltage at node 34 (the junction of resistor 28 and source 26). The output of the comparator 24 at node 21 is also connected inductor 20 through a series resistor 32.

In operation, inductor 20 is driven with a positive voltage until the current to the inductor exceeds the value which indicates that the inductor's core is saturated (which value is established by the reference voltage at node 34). At that time, the voltage at node 33 changes toward zero and comparator 24 switches state; thus the polarity of the driving voltage at the comparator's output changes. The comparator switches when the voltage across resistor 32 exceeds the voltage of the voltage source 26. When the core saturates in the reverse direction, a similar switching action occurs. The value of the current indicating core saturation is set by the bipolar voltage source 26 and resistor 28. (The bipolar source may be replaced by a resistor, but errors would increase since the current at which the comparator switches would be affected by asymmetry of the output voltage from the comparator 24, and the fact that the permeability of inductor 20 is not zero at saturation.) The saturation current threshold is thus given by the relationship $$I_{lim} = \frac{V_Z}{R_{32}}$$

where $I_{lim}$ represents the saturation current, $V_Z$ represents the magnitude (unsigned) of the bipolar voltage source output (i.e., the limited swing of the output of comparator 24) and $R_{32}$ represents the resistance of resistor 32. The value of the swings at the output of the comparator 24 is set by the comparator itself, and may be a function of the power supplies used. Any asymmetry of the magnitude of the positive and negative comparator output swings causes a second-order error. If the voltage source 26 is ideal, this error vanishes.

Thus, the frequency of oscillation is determined by the driving voltage, the current limit, and the characteristics of the inductor core. The long-term time-average voltage across an inductor must, as is well known, be zero. This implies that the current through the inductor 20, is given by $$[I_L] = \frac{[V_{switch}]}{R_{32}},$$

where $V_{switch}$ represents the output voltage of the comparator 24, $I_L$ represents the current through inductor 20. The coupled brackets [ and ] indicate the average over a relatively long time of the bracketed variable or expression.

As indicated above, an externally applied magnetic field will "help" the core saturate in one direction and "hinder" it in the other. This has the result of causing the average inductor current to change and depart from zero. Resistor 32 acts to sense the current through inductor 20. In the presence of an external field, therefore, the driving voltage applied to the inductor 20 is lower on one-half cycle than the other, as a direct consequence of the fact that resistor 32 has a non-zero value. This, in turn, causes the duty cycle of the driving voltage at node 21 to depart from fifty percent. A duty cycle measurement system 14 provides an output which measures the magnitude of the departure of the duty cycle from fifty-percent. The duty cycle measurement system may, for example, be a microprocessor which directly receives the output of comparator 24 and utilizes a software timing loop to sense state changes (and thus duty cycle). The microprocessor can be part of a larger system which performs other functions, so that the addition of magnetic field measurement to that system involves minimal additional cost.

Figure 2:
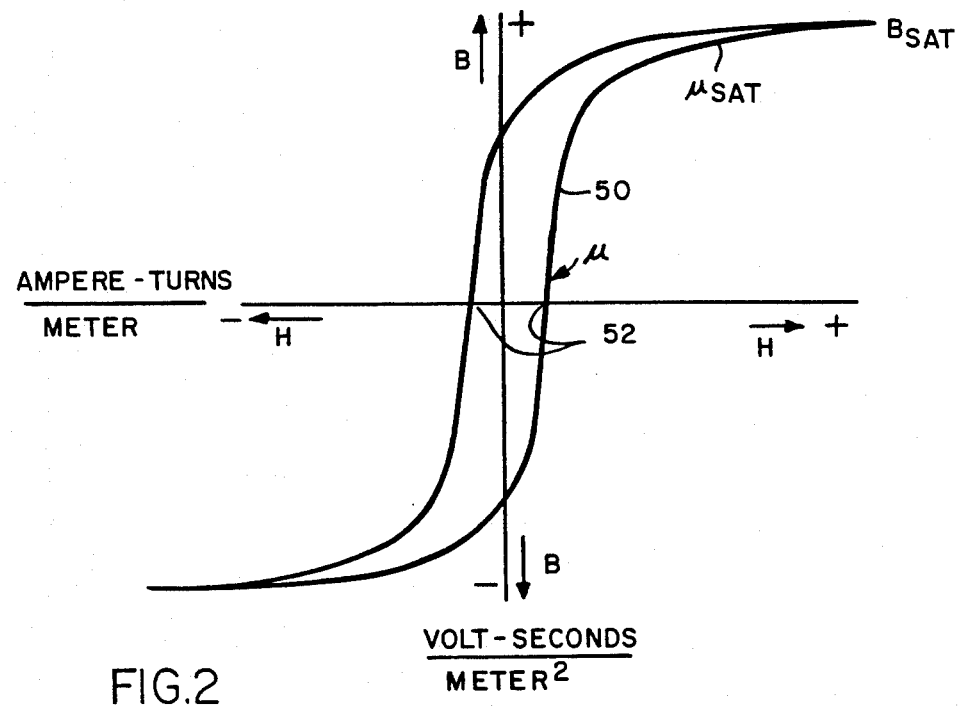
FIG. 2 is an idealized representation of a typical simple B-H curve for a saturable magnetic material.

For a more detailed explanation of how the application of an external field affects the operation of the oscillator, the reader is now referred to the simple B-H curve 50 shown in FIG. 2. There, the y-axis represents the magnetic flux density, B, which may be measured in volt-seconds per square meter. Restricting attention to the region within the windings of a cylindrical inductor, the flux density will increase in proportion to the integral of the applied voltage:

$$B = \frac{\int V \, dt}{A}$$

where A is the cross-sectional area of the cylinder, in square meters. The x-axis represents magnetic field intensity, H, which may be measured in ampere-turns per meter. In this case, the "meter" represents the measure of the "effective magnetic path length." This is easiest to visualize as the circumference of a toroidal core of small cross-section. For a cylindrical core, part of the path is in the core and part is in the surrounding air. The field intensity is proportional to the number of turns in the inductor for a given current, since the value of the current is identical for all turns. That is:

$$H = \frac{I_L N_t}{m}$$

where $I_L$ represents the inductor current, $N_t$ represented the number of turns and m represents the effective magnetic path length.

Magnetometer operation is sensitive to hysteresis effects in the inductor core, so a core material must be selected for the proper hysteresis qualities. In general, the smaller the remnant magnetization 52 of the core material, the smaller the offset current which may be contributed by hysteresis.

Figure 3:
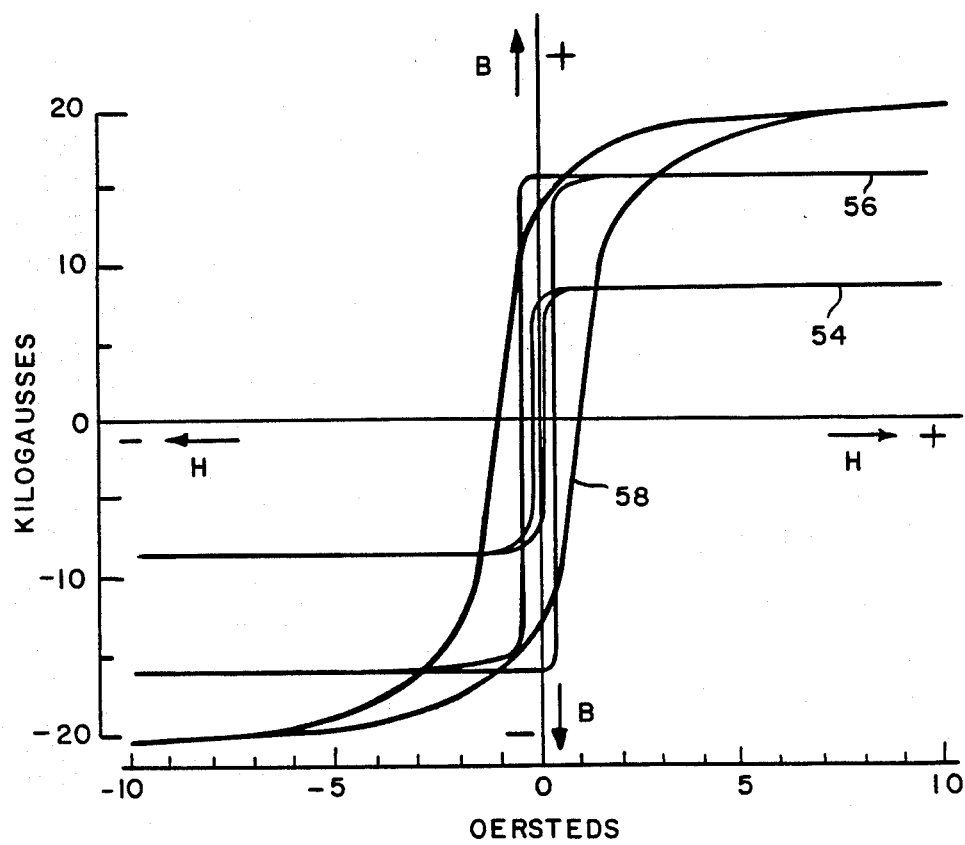
FIG. 3 are observed B-H curves for three magnetic materials which may be used as core material for the inductor of the present invention.

FIG. 3 shows typical B-H curves for several core materials: supermalloy—curve 54; Orthonol (a registered trademark of Spang & Company, Butler, Pa.)—curve 56; and Silectron (a registered trademark of Allegheny Ludlum Steel Corporation, Pittsburgh, Pa.)—curve 58. Each material is characterized by its saturation flux density ($B_{sat}$), permeability ($\mu$), and the shape of the B-H curve (particularly the shape of the "corners"). Supermalloy may be called a "square-loop material", whereas Silectron may be called "round-loop."

Figure 4:
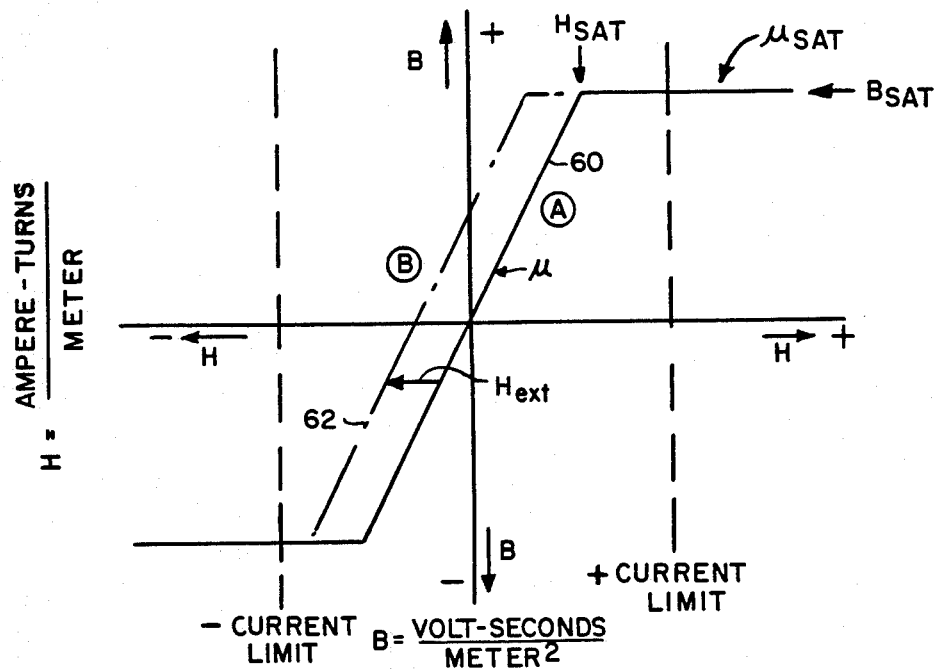
FIG. 4 is a diagram of a piece-wise linear approximation of a representative B-H curve, depicting the effects of an externally applied magnetic field.

To further simplify the explanation, an approximation will now be used for the B-H curve, ignoring hysteresis and offering a piece-wise linear model for the curve's shape. This approximation is shown in FIG. 4. There, for values of H greater than $H_{sat}$, B increases at a rate $\mu_{sat}$, which is non-zero and substantially smaller than $\mu$. The permeability, $\mu$, may be defined as $B_{sat}/H_{sat}$. In the presence of an external field, $H_{ext}$, the oscillator will act as if the B-H curve 60 has shifted off of the origin along the H-axis (e.g., to the position of curve 62). This movement is equivalent to that which would be produced by a second winding with a constant current, or by a current source in parallel with the single winding. This leads to an asymmetry in the current waveform, $I_L(t)$.

A graphical explanation can also be given and will be discussed with reference to FIG. 5. Assuming $R_{32}$ is small and the permeability at saturation is zero, the "operating point" moves at a constant rate along the B-axis between $-B_{lim}$ and $+B_{lim}$, changing directions at the current limits, or "corners", along with the sign of the voltage, V, since the saturation permeability is zero. In the presence of an external magnetic field, the operating point spends more time on one side of the B-axis than the other side; the resulting areas used to calculate net inductor current (i.e., q and r shown on FIG. 5) are therefore unequal. This implies an average value of inductor current exactly equal and opposite to that induced by the applied field.

Another way of thinking about the operation is that the operating point of the oscillator can be "averaged" and represented as a single point on the B-H curve. Since the apparent B-H curve of the core is symmetrical about the H-axis for all values of $H_{ext}$, then the average B will always be zero. This is the same as stating that the time average voltage across the inductor is zero, as was done earlier. The "average" H will be equal and opposite to $H_{ext}$. Therefore, the time average value of the current $I_L$ must be proportional to $H_{ext}$. The saturation "knees" or "corners" may be thought of as a way to reset the constant of the integral, C, $$B = V \, dt = \int_0^{t+} V \, dt + C_{t_- \to 0}$$

by forcing B to a known value, $B_{sat}$. Note that the sensitivity of $B_{sat}$ to changes in the current limits is inversely proportional to $\mu_{sat}$.

Figure 5:
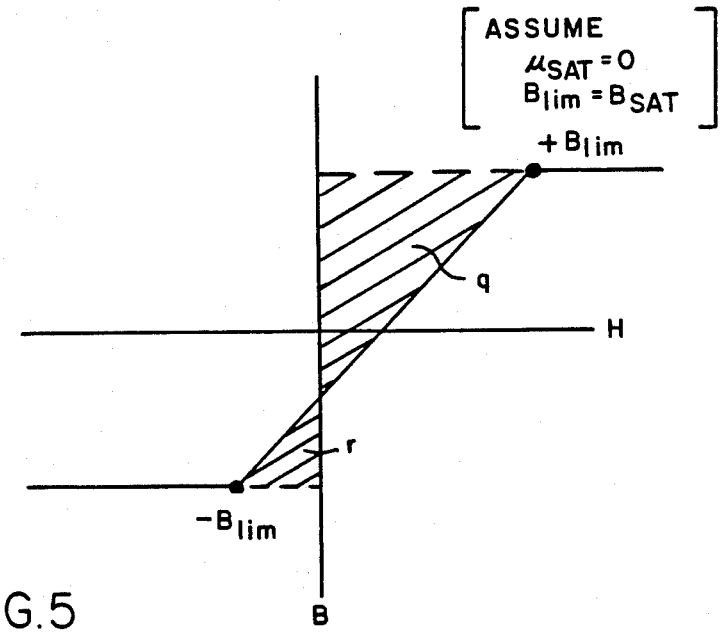
FIG. 5 is a diagram showing the effect of an applied magnetic field on the areas used in the calculation of net inductor current.

The average inductor current over one-half cycle is $$[I_L] = \frac{2}{t_{period}} \int_{t_-}^{t_+} I_L \, dt,$$

which is the sum of the two areas q and r in FIG. 5:

$$\int_{t_-}^{t_+} I_L \, dt = \text{area } r - \text{area } q.$$

Capacitor 84 is used to guarantee oscillation by preventing the comparator from getting trapped in a stable state in which both of its inputs and its output are all at zero; with the addition of capacitor 84, both inputs will not go to zero at the same time when the comparator output switches through zero. Capacitor 84 may be omitted when a true voltage comparator is used for element 24 instead of an operational amplifier, if the comparator exhibits hysteresis typical of many such devices. The inductor may comprise approximately 50 turns of wire on a model 50086-2F toroidal core from Magnetics, Inc. of Butler, Pa.

Having thus described the invention and multiple embodiments thereof, it is my intention that various alterations, modifications and improvements which are not expressly stated herein are nevertheless suggested and will readily occur to those skilled in the art to which the invention pertains. Thus the foregoing discussion is intended to be illustrative only and not limiting. To the extent they are obvious herefrom, those alterations, modifications and improvements are intended as part of the invention, which is limited only by the following claims and equivalents thereto.

What is claimed is:

1. An instrument for measuring a magnetic field, comprising:

a. an oscillator employing a saturable core inductor as the principal element thereof for storage of potential energy and having a voltage source whose output switches between a first voltage for driving the core to saturation in a first direction and a second voltage for driving the core to saturation in a second direction, the first and second voltages being of equal magnitude and opposite polarity;

b. the oscillator further comprising means, coupled to the voltage source and responsive to the saturation of the core, for causing the output of the voltage source to switch
   (i) from the first voltage to the second voltage when the inductor core saturates in the first direction and
   (ii) from the second voltage to the first voltage when the inductor core saturates in the second direction; and c. means coupled to the output of the voltage source, for measuring the average DC current in the inductor, said current representing the component of the magnetic field impinging upon the inductor along the axis of its core.

2. The instrument of claim 1 wherein the means for measuring the average DC current measures deviation in duty cycle from a nominal fifty-percent.

3. The instrument of claim 1 wherein the means to cause the output of the voltage source to switch includes
   (i) a resistor connected between the output of the voltage source and one lead of inductor, and
   (ii) means for sensing a change of voltage on said one lead of the inductor indicator of inductor core saturation.

4. A magnetometer comprising:
a. a comparator having an inverting input, a non-inverting input and an output;
b. an inductor comprising a single winding wound on a saturable core material;
c. a first resistor connected in series between the output of the comparator and a first lead of the inductor winding;
d. the second lead of the inductor winding being connected to ground;
e. the non-inverting input of the comparator being connected to the first lead of the inductor winding;
f. means, connected between the output of the comparator and the inverting input of the comparator for establishing a bipolar reference voltage which switches polarity in response to the polarity of the voltage at the output of the comparator; and
g. means, coupled to the output of the comparator, for measuring the average DC current in the inductor, said current representing the component of the magnetic field impinging upon the inductor along the axis of its core.

5. The magnetometer of claim 4 wherein the means for establishing a reference voltage comprises:
   (i) a pair of Zener diodes connected back-to-back in series, one lead of the pair being connected to the output of the comparator, and
   (ii) a resistor connected between the other lead of the Zener diode pair and ground,
   the non-inverting input of the comparator being connected to the junction of the resistor and the Zener diode pair.

6. An instrument as set forth in claim 1 wherein the means for measuring the average DC current in the inductor comprises means for measuring the deviation from 50% of the duty cycle of the output of the voltage source.

7. A magnetometer as set forth in claim 4 wherein the means for measuring the average DC current in the inductor comprises means for measuring the deviation from 50% of the duty cycle of the signal at the output of the comparator.

8. An instrument for measuring a magnetic field, comprising:
an inductor comprising a coil wound on a core of a saturable material having a first end coupled to a common ground and a second end;
a resistor having a first end coupled to the second end of the inductor and a second end;
a voltage source having at least one input coupled to the second end of the inductor and an output coupled to the second end of the resistor and which is switchable between a first voltage for driving the core into saturation in a first direction and a second voltage for driving the core into saturation in a second direction, the first and second voltages being of equal magnitude and opposite polarity, and the switching of the voltage source output being responsive to the instantaneous inductor current such that the voltage source switches states when the inductor current indicates that the core is saturated; and
means, coupled to receive the current through the inductor, for measuring the average current in the inductor, wherein the average current represents the component of the magnetic field along the axis of the inductor core.

9. An instrument as set forth in claim 8 wherein the means for measuring the average current in the inductor comprises means for measuring the deviation of the duty cycle of the output of the voltage source from 50%.

10. An instrument as set forth in claim 8 wherein the voltage source comprises:
a comparator having first and second inputs and an output, the signal at the output having fixed magnitude and alternating polarity, the polarity being responsive to the polarity of the difference between the voltages at the first and second inputs;
the first input being coupled to the second end of the inductor; and
a reference voltage coupled to the second input of the comparator and responsive to the output of the comparator.

* * * * *